United States Patent [19]

Batey et al.

[11] Patent Number: 5,068,124
[45] Date of Patent: Nov. 26, 1991

[54] METHOD FOR DEPOSITING HIGH QUALITY SILICON DIOXIDE BY PECVD

[75] Inventors: John Batey; Elaine Tierney, both of Danbury, Conn.

[73] Assignee: International Business Machines Corporation, Armonk, N.Y.

[21] Appl. No.: 438,920

[22] Filed: Nov. 17, 1989

[51] Int. Cl.$^5$ ................... C23C 16/40; C23C 16/50
[52] U.S. Cl. ...................................... 427/39; 427/38; 427/255.2; 427/255.3
[58] Field of Search ............ 427/38, 39, 255.2, 255.3

[56] References Cited

U.S. PATENT DOCUMENTS

| | | |
|---|---|---|
| 4,223,048 | 9/1980 | Engle, Jr. |
| 4,232,063 | 11/1980 | Rosler et al. |
| 4,239,811 | 12/1980 | Kemlage |
| 4,385,975 | 5/1983 | Chu et al. |
| 4,842,941 | 1/1989 | Devins et al. ......................... 427/39 |
| 4,883,686 | 11/1989 | Doehler et al. ....................... 427/47 |

FOREIGN PATENT DOCUMENTS 0272140 6/1988 European Pat. Off.
247925 7/1981 German Democratic Rep.

OTHER PUBLICATIONS

Taylor, R. C. et al., "Hexachlorodisilane as a Precursor in the LPCVD of Silicon Dioxide and Silicon Oxynitride Films", *Journal Electrochem. Soc.*, 136(8):2382 (1989).

Rahman, S. A. et al., "The Effect of Annealing on PECVD Silicon Dioxide Thin Films Produced From $N_2O:SiH_4:He$ Gas Mixtures" *Singapore Journal of Physics*, 6(2):29 (1989).

Cobianu, C. et al., "Silane Oxidation Study: Analysis of Data for $SiO_2$ Films Deposited by Low Temperature Chemical Vapor Deposition"; *Thin Solid Films*, 117(3):211 (1984).

Mshima, Y., et al., "Direct Photochemical Deposition of $SiO_2$ from the $Si_2H_6+O_2$ System", *Journal of Applied Physics*, 55(4):1234 (1984).

Adams, A. C., et al., "Characterization of Plasma-Deposited Silicon Dioxide", *Journal Electrochem. Soc.*, 128(7):1545 (1981).

Batey et al., "Electrical Characteristics of Very Thin $SiO_2$ Deposited at Low Substrate Temperatures", IEEE Electron Device Letters, vol. EDL-8, No. 4, Apr. 1987.

Batey et al., "Low-Temperature Deposition of High-Quality Silicon Dioxide by Plasma-Enhanced Chemical Vapor Deposition", J. Appl. Phys. vol. 60, No. 9, Nov. 1986.

Adams, Solid State Technology, 26, 135 (1983).

Hollahan, J. Electro Chemical Society, 126, 933 (1979).

*Primary Examiner*—Shrive Beck
*Assistant Examiner*—Margaret Burke
*Attorney, Agent, or Firm*—Scully, Scott, Murphy & Presser

[57] ABSTRACT

A method for depositing high quality silicon dioxide in a plasma enhanced chemical vapor deposition tool is described. The reactant gases are introduced into the tool together with a large amount of an inert carrier gas. A plasma discharge is established in tool by using a high RF power density thereby depositing high quality silicon dioxide at very high deposition rates. In a single wafer tool, the RF power density is in the range of 1-4 $W/cm^2$ and the deposition rate is from 600-1500 angstroms per minute for depositing high quality $SiO_2$ films.

20 Claims, 2 Drawing Sheets

METHOD FOR DEPOSITING HIGH QUALITY SILICON DIOXIDE BY PECVD

BACKGROUND OF THE INVENTION

1. Field of the Invention

This invention is directed to the deposition of silicon dioxide films by plasma enhanced chemical vapor deposition (PECVD) and more particularly, to an improved method for depositing high quality $SiO_2$ films at high deposition rates.

2. Background of the Invention

Current trends in metal oxide semiconductor (MOS) technology are towards higher chip packing density, more complex devices with more process levels, and larger substrates. To accommodate these advances, MOS device dimensions must be scaled down and high temperature processing steps must be minimized. Future generations of MOS devices will require very high quality silicon dioxide ($SiO_2$) gate dielectrics and low temperature processing. The deposition of dielectrics or insulators at low temperatures also has applications in a number of other semiconductor device technologies. For example, as secondary passivation layers, interlayer isolation, and lithographic masks in integrated circuits and also as primary gate dielectrics for thin film transistor (TFT) applications.

In addition, the modern trend is towards the use of single wafer deposition tools which necessitates very high deposition rates (at least 600-1000 angstroms per minute) for the tools to be commercially viable.

The conventional method for forming $SiO_2$ gate dielectrics is to thermally grow the oxide films at temperatures from about 800°-100° C. The thermal oxide films have excellent electronic and mechanical qualities that have made this process the most widely used for conventional semiconductor transistor applications. However, in view of the above described new direction in manufacturing, there is a need for a method to deposit $SiO_2$ films at low temperatures that have both electronic and mechanical qualities comparable to thermal oxides.

Plasma enhanced chemical vapor deposition (PECVD) is a technique which is used to deposit electronic materials at high rates and/or at low temperatures. Historically, however, oxide deposited at low temperatures has been far from electronic grade and although various properties of PECVD oxide have been reported in the literature, Adams, *Solid State Technology*, 26, 135 (1983), and Hollahan, *J. Electro Chemical Society*, 126, 933 (1979), there have been no reports of oxides with electrical characteristics approaching those deposited by conventional high temperature techniques. Thus, due to the fact that the electronic and physical characteristics of $SiO_2$ films deposited by conventional PECVD are relatively poor, applications have been limited to those areas where film quality is relatively unimportant.

Recently, it has been shown that by modifying the PECVD technique, thin films of $SiO_2$ of exceptionally high quality can be deposited at very low substrate temperatures (350° C. or less). See, Batey et al., *J. Appl. Phys.*, 60, 3136 (1986) and Batey et al., *IEEE Electron Dev. Lett.* EDL-8, 148 (1987). The Batey et al. technique combines very low flows of reactive gases with massive amounts of helium dilution and a low radio frequency (RF) power density. As a result, the deposition proceeds at a much reduced rate and film quality is much improved. Typical process parameters for the Batey et al. technique are: 2% $SiH_4$ in He with a flow rate of about 20 sccm, $N_2O$ with a flow rate of about 50 sccm, He with a flow rate of about 2,000 sccm or greater, pressure of about 1 Torr and an RF power density of about 0.02 W/cm$^2$. The large amount of helium dilution insures uniformity and high quality. However, it was determined that the film properties depend strongly on the deposition rate, which had to be kept below a critical value of about 80 angstroms per minute or less. While good quality films were obtained, the deposition rate is too low for many applications, a problem which is magnified by the trends in the industry towards single wafer processing.

Another prior art method of depositing $SiO_2$ films in a PECVD system is disclosed in U.S. Pat. No. 4,223,048 to Engle, Jr. Engle, Jr. is directed to a batch processing system which utilizes interleaved electrodes and vertical positioning of the wafers in order to improve the uniformity of the films. Engle, Jr. teaches a very high flow rate of $N_2O$ (1,000 liters per minute), a flow rate of $SiH_4$ of about 50 sccm and a flow rate of $O_2$ of about 10-20 sccm. The plasma discharge is established by a low RF power (20 watts) and a deposition rate of approximately 500 angstroms per minute is achieved. While there is no mention of the electronic quality of the films, it is likely the electronic quality would be poor at such a high deposition rate. Moreover, the deposition rate still remains below that necessary for single wafer processing.

SUMMARY OF THE INVENTION

The present invention improves upon the Batey et al. technique by depositing high quality $SiO_2$ films in a PECVD system at high deposition rates. The method of the present invention utilizes large He dilution with high reactant gas flow rates and a very high RF power density. In a single wafer tool, with an RF power density on the order of 1 to 4 W/cm$^2$, $SiO_2$ films were deposited by the inventive method at rates of from 600 to 1500 angstroms per minute with excellent electronic and mechanical properties. MOS capacitor structures formed with gate insulators deposited by the present method exhibited such characteristics as: essentially zero current leakage, very low interface state density, no premature current injection, and a breakdown field similar to that obtained in thermal oxide structures. Excellent mechanical properties were also exhibited such as, an etch rate of less than two times that of thermal oxides, very low pinhole density, excellent uniformity and density, and stoichiometry very close to $SiO_2$ with almost no chemical impurities.

DETAILED DESCRIPTION OF THE INVENTION

Figure 1:
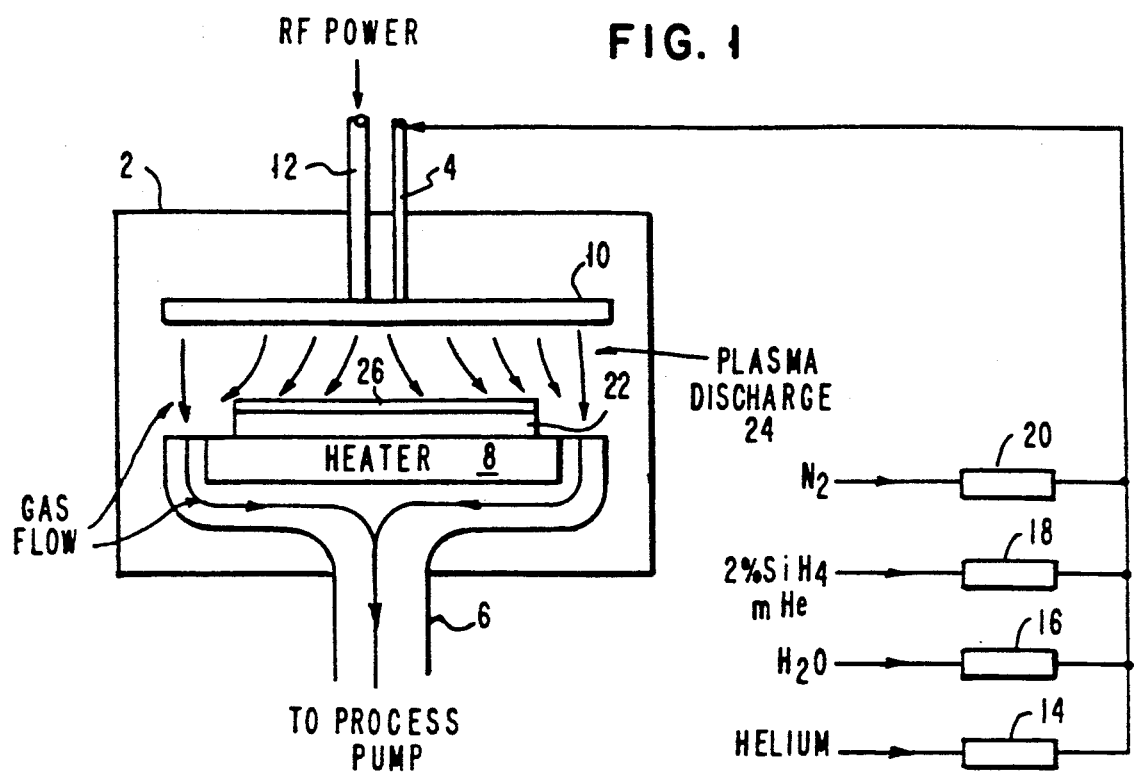
FIG. 1 is a schematic diagram of a single wafer PECVD system used in the method of the present invention.

The method of the present invention provides for the deposition of high quality silicon dioxide on a substrate in a PECVD deposition tool. In the first step of the method, flows of reactant gases containing oxygen and silicon, and a very large flow of an inert carrier gas are introduced into the reaction chamber of the tool. Typically, the silicon containing reactant gas is diluted in an inert carrier gas, with the silicon containing reactant gas being from 1.4% to 2% of the mixture. The flow rate of the silicon containing reactant gas must be 150 sccm or greater, with the preferred range being from 200 sccm to 400 sccm for a five inch single wafer tool. The flow rate for the oxygen containing reactant gas must be 200 sccm or greater, with the preferred range being from 280 sccm to 560 sccm for a five inch single wafer tool. Moreover, the ratio of the oxygen containing reactant gas to the diluted silicon containing reactant gas must be large enough to insure deposition of films close to the stoichiometry of $SiO_2$, this ratio being typically greater than 1. The conventional reactant gases of $N_2O$ and $SiH_4$ are used; however, any suitable oxygen containing reactant gas and silicon containing reactant gas may be utilized. In addition, the inventive method may be used in larger single wafer tools and in multi-wafer tools, it being understood by those skilled in the art that the flow rates will be adjusted based on the size of the reaction chamber.

As stated above, in addition to the oxygen and silicon containing gas flows, a large flow of inert carrier gas is also introduced into the reaction chamber. The flow rate of the inert carrier gas must be 1000 sccm or greater with the preferred flow rate being about 2000 sccm for a single wafer tool. The preferred carrier gas is helium because of its light weight; however, other carrier gases may also be used such as argon, neon and zenon.

A PECVD system is a low temperature system and is typically operated with temperatures in the range of about 250° C. to 600° C. The pressure in the system is often used to tailor certain film properties and is typically 5 Torr or less.

In a second step of the method of the invention, a plasma discharge is then established in the reaction chamber of the tool by applying sufficient RF power to provide a power density of about 1 $W/cm^2$ or greater with the preferred range being between 1 and 4 $W/cm^2$. The present method results in the deposition of high quality silicon dioxide films at deposition rates from about 600 to 1500 angstroms per minute.

In accordance with one preferred embodiment of the present invention, a PECVD single wafer tool was used with a flow rate ratio of $N_2O$ to $SiH_4$ in He of 560/400 sccm and a RF power density in the range from 1 $W/cm^2$ to 4 $W/cm^2$, which resulted in high quality $SiO_2$ films being deposited at rates from about 1100 angstroms per minute to about 1500 angstroms per minute. Thus, device quality silicon dioxide films can now be deposited in a single wafer PECVD tool at commercially acceptable deposition rates.

Referring now to the drawings, FIG. 1 is a simplified schematic diagram of a single wafer PECVD tool having a reaction chamber 2 with a gas inlet 4 and a gas exit 6. The chamber is provided with a heater 8 and a power electrode 10 having cable 12 connected thereto which leads to an RF power source, not shown. Four flow controllers are provided for the introduction of the necessary gases. Controller 14 introduces the large flow of inert carrier gas (He), controller 16 introduces the oxygen containing reactant gas ($N_2O$), controller 18 introduces the silicon containing reactant gas ($SiH_4$ in He) and controller 20 introduces $N_2$, which is used as a purge gas. A substrate 22 is positioned on the heater 8 and the system is ready for the deposition of an $SiO_2$ layer on the substrate. The substrate may be a semiconductor material for forming a metal oxide semiconductor (MOS) device or a metal for forming a metal oxide metal (MOM) device. The preferred substrate is silicon, however, the present invention is not limited to silicon substrates, as high quality $SiO_2$ may be deposited on a broad range of substrate materials, including metals, non-silicon semiconductors, glasses and other materials.

In operation, the gas flow controllers 14, 16 and 18 are activated to permit the required flow rates of $N_2O$, $SiH_4$ and He to enter the chamber. The RF power electrode 10 is then activated to provide the required power density. A plasma discharge 24 is thereby established in the chamber 2 causing a silicon dioxide layer 26 to be deposited onto the substrate 22. The present invention may be used to deposit a wide range of oxide film thickness, from very thin to thick film, all at device grade quality.

The following examples are included merely to aid in the understanding of the invention and variations may be made by one skilled in the art without departing from the spirit and scope of the invention.

EXAMPLE 1

In this example, the following conditions were kept constant:

$N_2O = 16$ sccm
1.4% $SiH_4$ in He = 12 sccm
He = 2000 sccm
pressure = 5 Torr
reaction temperature = 350° C.

Films were deposited at RF power densities of: 0.1, 0.2, 0.5, 1, 2, and 3.25, $W/cm^2$. Results of Example 1 are shown in Table I below:

TABLE I

| Film No. | RF Power Density ($W/cm^2$) | Refractive Index | Deposition Rate (A/min) | Etch Rate* | Stress (Dynes/$cm^2$) |
|---|---|---|---|---|---|
| 1 | 0.1 | 1.469 | 55 | 1.34 | 3.10 |
| 2 | 0.2 | 1.469 | 56 | 1.26 | 3.05 |
| 3 | 0.5 | 1.468 | 50 | 1.25 | 2.76 |
| 4 | 1 | 1.467 | 43 | 1.27 | 2.34 |
| 5 | 2 | 1.465 | 31 | 1.23 | 1.93 |
| 6 | 3.25 | 1.464 | 26 | 1.35 | 1.95 |

*Etch rate is the factor greater than the rate for thermal oxide in (7:1) BHF at 23° C.

EXAMPLE 2

In this example, the pressure, temperature and helium flow rate are identical to that of Example 1. In this example, however, the RF power density was kept constant at 2 $W/cm^2$ but the flow rates of the reactant gases were varied at the following ratios of $N_2O/1.4\%$ $SiH_4$ in He: 16/12, 35/25, 70/50, 140/100, 280/200, and 560/400 sccm. The results of this example are shown in the following Table II below:

TABLE II

| Film No. | Flow rates N₂O/SiH₄ (sccm) | Refractive Index | Deposition Rate (A/min) | Etch Rate* | Stress (Dynes/cm²) |
|---|---|---|---|---|---|
| 1 | 16/12 | 1.465 | 31 | 1.23 | 1.93 |
| 2 | 35/25 | 1.467 | 63 | 1.28 | 2.41 |
| 3 | 70/50 | 1.468 | 107 | 1.3 | 2.62 |
| 4 | 140/100 | 1.469 | 250 | 1.3 | 3.12 |
| 5 | 280/200 | 1.470 | 607 | 1.38 | 3.31 |
| 6 | 560/400 | 1.471 | 1368 | 1.59 | 3.45 |

*See Table I

EXAMPLE 3

In this example, the pressure, temperature and helium flow rate were kept the same as in Example 1. In this example, however, the N₂O/1.4% SiH₄ in He flow rate ratio was kept constant at 560/400 sccm. The RF power density was again varied at 0.1, 0.2, 0.5, 1, 2, and 3.25, W/cm². The results of this example are shown in the following Table III:

TABLE III

| Film No. | RF Power Density (W/cm²) | Refractive Index | Deposition Rate (A/min) | Etch Rate* | Stress (Dynes/cm²) |
|---|---|---|---|---|---|
| 1 | 0.1 | 1.464 | 1210 | 2.63 | 2.55 |
| 2 | 0.2 | 1.460 | 1415 | 2.63 | 3.10 |
| 3 | 0.5 | 1.462 | 1478 | 2.31 | 3.24 |
| 4 | 1 | 1.467 | 1469 | 1.85 | 3.38 |
| 5 | 2 | 1.471 | 1368 | 1.59 | 3.45 |
| 6 | 3.25 | 1.470 | 1138 | 1.53 | 3.31 |

*See Table I

In each of the above examples, the equipment used was an Applied Material Precision 5000 PECVD tool. The reaction chamber and flow controllers of such a system are shown in FIG. 1 in a simplified schematic form.

In Example 1, the low reactant flow rate ratio resulted in a decrease in the deposition rate as the power density was increased, indicating that there was an insufficient amount of silane to continue to deposit SiO₂. In Example 2, it is seen that as the reactant flow rate was increased, the deposition rate also increased. A significant result was obtained in that the quality of the layer remained good as shown by the relatively constant etch rate for each film. Provided the films are close to stoichiometric, the etch rate is a good figure of merit for physical quality, and it is known that an etch rate of less than 2 times that of thermal oxide is an indication of a good quality film.

Example 3 shows that at high reactant flow rates the deposition rate will be high, independent of the power density. However, a further significant result was obtained in that the quality actually increased as the power density was increased. The quality factor is again seen by the etch rate which was above 2 for power densities below 0.5 W/cm² and below 2 for power densities of about 1 W/cm² or greater. Thus, it can be seen from the three examples, in particular, films 5 and 6 of Example 2, and films 4, 5 and 6 of Example 3, that for a power density of about 1–4 W/cm² and a flow rate ratio of the reactant gases within the range of about 280/200–560/400 sccm, a high quality film was deposited at rates from about 600 angstroms per minute to about 1500 angstroms per minutes.

For insulators which are to be considered for primary insulation purposes, such as gate insulators, the most important property is the electrical integrity. The interfacial region is clearly an important concern, but equally important are the bulk properties; fixed insulator charge, transient charging, leakage current and stability. Many of these properties can be assessed from simple I-V or C-V characteristics of MOS or MOM structures.

Figure 3:
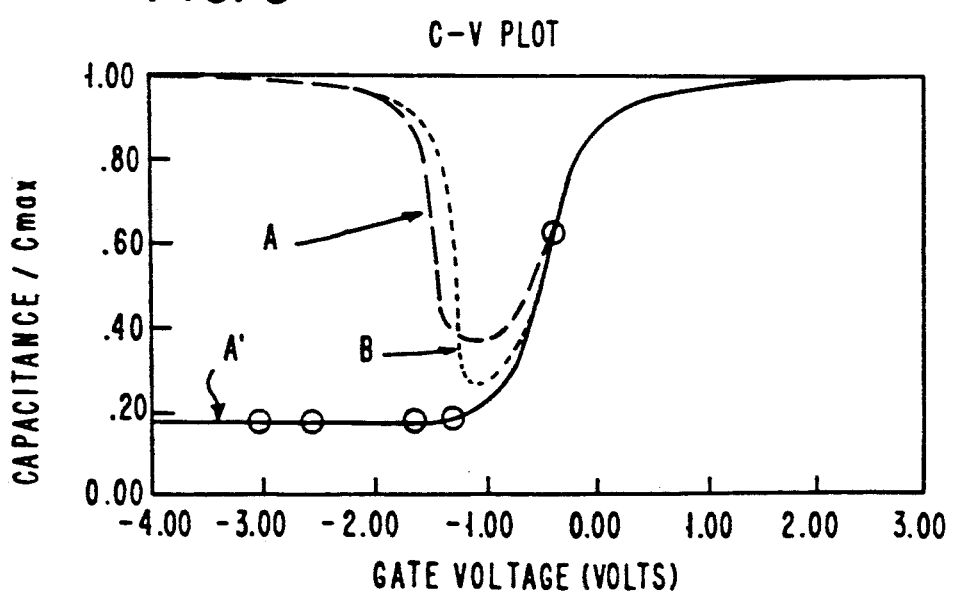
FIG. 3 is a graph of the C-V characteristics comparing the conventional PECVD MOS structure (A) to the MOS structure (B) formed in accordance with the present invention.
Figure 2:
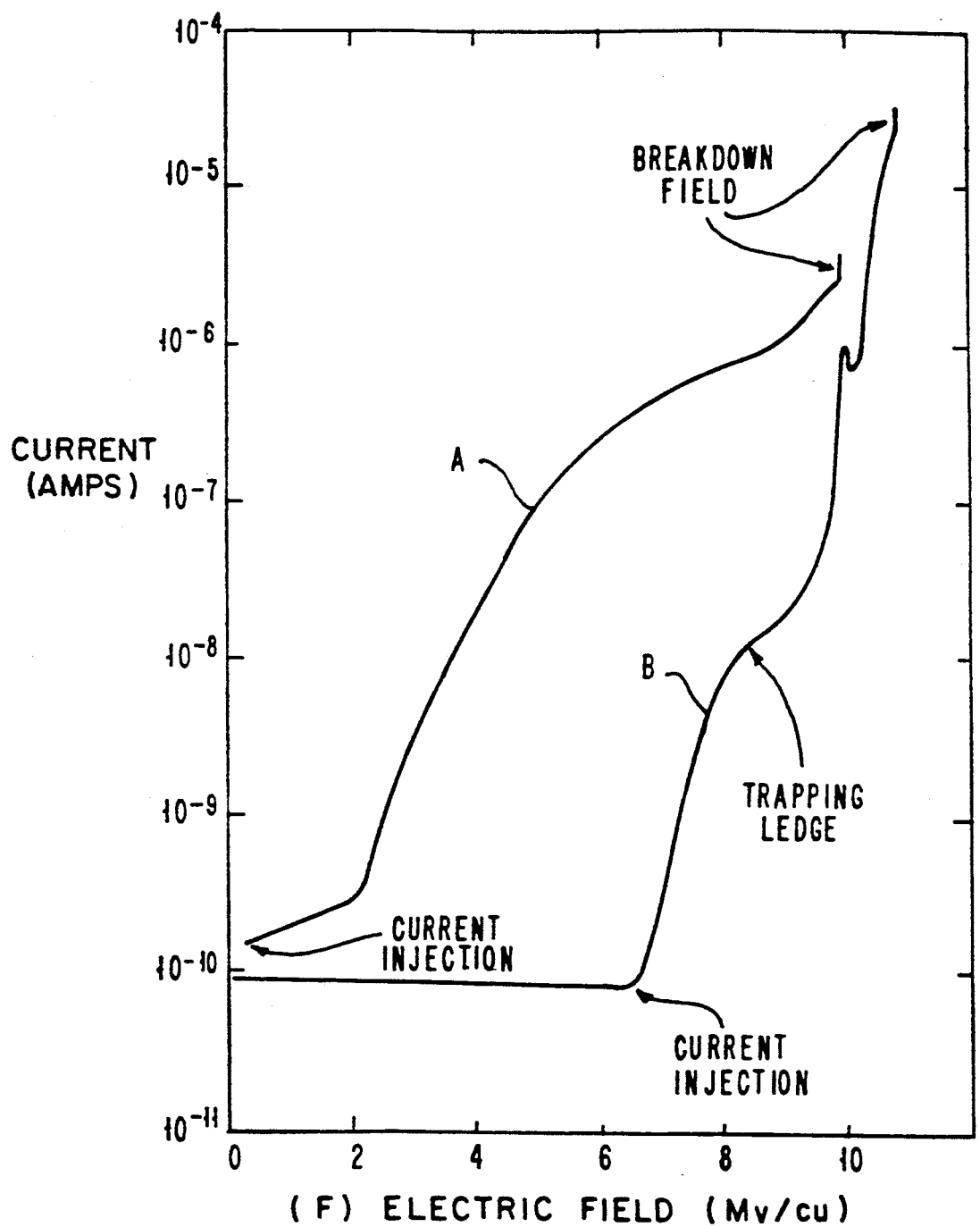
FIG. 2 is a graph showing ramp I-V characteristics comparing the characteristic (A) of a MOS structure formed with a $SiO_2$ gate layer deposited with a high deposition rate at low RF power density and a characteristic (B) of a MOS structure having an $SiO_2$ gate layer formed in accordance with the present invention.

For electrical characterization, aluminum counter electrodes, typically 500–1000 angstroms thick with an area of about $5.2 \times 10^{-3}$ cm², were evaporated through a shadow mask on the PECVD deposited SiO₂ layer and the back side of the wafer was etched to insure good contact. FIGS. 2 and 3 show I-V and C-V characteristic curves for MOS structures formed as above. For comparison purposes, curve A in FIGS. 2 and 3 corresponds to film No. 1 of Example 3 and curve B of FIGS. 2 and 3 corresponds to film No. 5 of Example 3.

FIG. 2 shows dynamic ramp I-V curves from which much information can be ascertained relative to the electrical properties of the SiO₂ film. For curve B, the onset of current injection from the silicon substrate occurs at F 6–7 MV/cm, as expected for Fowler-Nordheim injection through the 3.2 eV barrier corresponding to the Si:SiO₂ conduction band discontinuity. The pronounced ledge in curve B is related to trapping events in the bulk of the film. This is a powerful technique as trap parameters such as the capture cross-section and capture probability can be determined. This capture probability is related to the current level at which the ledge is observed, the ramp rate and the centroid of the charge distribution. Curve B shows that the trapping level occurs at about $10^{-8}$ A which is indicative of a relatively low trapping probability. Thus, the high current injection, the high breakdown field and the low trapping probability results in a characteristic that resembles thermally grown SiO₂.

In contrast, curve A of FIG. 2 shows a ramp I-V characteristic for a PECVD film deposited at 0.1 W/cm², film 1 of Example 3. The electrical integrity of this film is very poor. Premature current injection occurs at very low fields, less than 1 MV/cm and there is no well defined trapping ledge. In addition, it has been determined that the characteristics were not reproducible from run to run as the premature injection varied greatly.

The data of FIG. 2 indicates the improvement in the electrical integrity of the SiO₂ film with increasing RF power density. With a power density of 2 W/cm², premature injection is reduced and the breakdown field increases. It has been determined that the I-V curves for films 4 and 6 of Example 3 and films 5 and 6 of Example 2 are similar to curve B of FIG. 2. The above characteristics have shown to be reproducible from run to run.

It is clear from FIG. 2 that the leakage current for curve B is essentially zero for fields less than 5 MV/cm. The absence of low field breakdowns indicates that pinholes and growth defects should not be a problem. Curve A is a leaky oxide. It would require several thousand angstroms of material to minimize the gate leakage and gradual charging of the oxide would be a long term stability problem making the film useless for applications that require good electrical integrity.

FIG. 3 shows C-V data for a MOS capacitor fabricated on a 2 ohm-cm silicon substrate for the films identified for curves A and B of FIG. 2. Curve A' is the high-frequency characteristic for film 5 of Example 3. These data were measured after a postmetallization anneal (PMA) in forming gas (10% H₂ in N₂) at 400° C.

for 30 min. Curves A and B are low frequency (quasi-static) characteristics which can be analyzed to measure the interface state density. The interface state density causes a deviation of the quasistatic curve from the high frequency curve, the magnitude of which can be used to determine the interface state density. The difference between curves A and A' at about −1 volts is caused by an interface state density of $3 \times 10^{11}$ cm$^{-2}$ eV, which is quite high. The difference between curve B and A' at about −1 volts is caused by an interface state density of $4 \times 10^{10}$ cm$^{-2}$ eV$^{-1}$, which is very low.

The refractive index measured by ellipsometry can be used to detect deviations from stoichiometry in good quality oxides. The known range for stoichiometric SiO$_2$ deposited by PECVD is from 1.46 to 1.52. As can be seen in Tables I, II and III, the refractive indices for all the films are close to 1.465 which is the index for thermal oxide. In addition, as stated above, a good figure of merit is the etch rate for the oxides. The etch rate shown in Tables I, II and III is the factor that the etch rate for the sample was greater than the etch rate for thermal oxide in 7:1 buffered hydrofluoric acid at 23° C. An etch rate factor of less than 2 is an excellent etch rate.

Additional tests on films 1 and 4 of Example 3 were performed to determine the extent of impurities. In film 1, there are significant amount of impurities such as nitrogen and hydrogen. In film 4, however, the only impurity found was a low amount of hydrogen.

Conventional PECVD process results (i.e. low or no He dilution), are comparable to that of curve A for FIG. 2 and are worse than curve A of FIG. 3. Typical conventional PECVD process conditions are 2% SiH$_4$ in He=200 sccm, N$_2$O=400 sccm, power density=0.1 W/cm$^2$, pressure 1–10 Torr, temperature=350° C., and a deposition rate of approximately 1000 angstroms per minute. The interface state density is approximately $10^{12}$ cm$^{-2}$ eV$^{-1}$ and the I-V curves indicate that the films are leaky. The etch rate is 2–4 times that of the thermal oxide and impurities are C, N and H.

As can be seen from the above data, the conventional PECVD process does not produce a high quality silicon dioxide layer at acceptable deposition rates for single wafer tools. In accordance with the present invention, a PECVD system utilizing large amounts of helium dilution and high RF power density produces high quality silicon dioxide films at very high deposition rates. As a result the low temperature PECVD system is now commercially useful for depositing device quality SiO$_2$ films.

While the invention has been particularly shown and described with respect to preferred embodiments thereof, it will be understood by those skilled in the art that the foregoing and other changes in form and details may be made therein without departing from the spirit and scope of the invention which would be limited only by the scope of the appended claims.

Having thus described the invention, what is claimed as new, and is desired to be secured by letters patent is:

1. A method for depositing high quality silicon dioxide on a substrate in a plasma-enhanced chemical vapor deposition tool, comprising the steps of:
    (a) introducing an oxygen containing reactant gas and a silicon containing reactant gas into said tool, said silicon containing reactant gas being diluted in an inert carrier gas, the flow rate of said diluted silicon containing carrier gas being 200 sccm or greater;
    (b) introducing a flow of said inert carrier gas at a flow rate of 1000 sccm or greater into said tool; and
    (c) establishing a plasma discharge in said tool by applying RF power density of about 1 W/cm$^2$ or greater, thereby depositing a layer of high quality silicon dioxide on said substrate.

2. The method of claim 1 wherein said oxygen reactant gas is N$_2$O said silicon reactant gas SiH$_4$.

3. The method of claim 1 or 2 wherein said carrier gas is selected from the group consisting of He, Ar, Ne, Xe.

4. The method of claim 2 wherein the carrier gas flow is 2000 sccm or greater.

5. The method of claim 4 wherein the carrier gas is He.

6. The method of claim 1 wherein the pressure is in the range of 5 Torr or less and the temperature is in the range of about 250° C. to 600° C., in said tool.

7. The method of claim 5 wherein the ratio of N$_2$O to SiH$_4$ in He is in the range of about 280/200 to 560/400.

8. The method of claim 7 wherein the RF power density is in the range of about 1 W/cm$^2$ to 4 W/cm$^2$.

9. The method of claim 1 wherein the silicon dioxide is deposited at a rate of 600 angstroms per minute or greater.

10. The method of claim 9 wherein the deposition rate is 1000 angstroms per minute or greater.

11. The method of claim 1 wherein said substrate is a semiconductor material.

12. The method of claim 11 wherein said substrate is silicon.

13. The method of claim 1 wherein said substrate is a metal.

14. The method of claim 1 wherein said substrate is a glass.

15. A method for depositing a layer of high quality SiO$_2$ on a substrate in a single wafer PECVD tool comprising the steps of:
    (a) introducing gaseous SiH$_4$ in He and gaseous N$_2$O in said tool at a flow rate ratio of N$_2$O to SiH$_4$ in He in the range of about 280/200 to 560/400;
    (b) introducing gaseous He into said tool at a flow rate in the range of about 2000 sccm;
    (c) establishing a plasma discharge in said tool at a pressure in the range of 5 Torr or less and at a temperature in the range of about 250° C. to 600° C., by applying RF power at a density in the range of about 1 W/cm$^2$ to 4 W/cm$^2$, thereby depositing a layer of high quality SiO$_2$ on said substrate.

16. The method of claim 15 wherein the SiO$_2$ layer is deposited at a rate in the range of about 600 angstroms per minute to 1500 angstroms per minute.

17. The method of claim 16 wherein said substrate is a semiconductor material.

18. The method of claim 16 wherein said substrate is silicon.

19. The method of claim 16 wherein said substrate is a metal.

20. The method of claim 16 where said substrate is a glass.

* * * * *